May 22, 1951 J. J. Z. VAN ZELST 2,554,132

AMPLIFIER CIRCUIT

Filed July 16, 1946

INVENTOR.
JOHANNES JACOBUS ZAALBERG VAN ZELST
BY Fred M. Vogel
AGENT.

Patented May 22, 1951

2,554,132

UNITED STATES PATENT OFFICE 2,554,132

AMPLIFIER CIRCUIT

Johannes Jacobus Zaalberg van Zelst, Eindhoven, Netherlands, assignor to Hartford National Bank and Trust Company, Hartford, Conn., as trustee Application July 16, 1946, Serial No. 684,071
In the Netherlands March 19, 1943

Section 1, Public Law 690, August 8, 1946
Patent expires March 19, 1963

9 Claims. (Cl. 179—171)

This invention relates to an amplifier circuit having a constant or substantially constant gain.

In the amplifier industry, for example in the measuring device industry or in telephone engineering, there may frequently be the need for an amplifier whose gain remains automatically constant.

This requirement, however, generally leads to the use of a highly involved amplifier circuit.

The present invention provides a circuit which permits of obtaining a practically constant gain in a simple manner.

The amplifier circuit according to the invention is characterized in that an auxiliary voltage whose frequency is not comprised in the frequency band of the oscillations to be amplified is amplified jointly with these oscillations and that from the auxiliary voltage amplified and rectified is withdrawn a control voltage by means of which the circuit is controlled in such manner that a constant or substantially constant amplification is automatically obtained.

The auxiliary voltage may be obtained for example from an auxiliary voltage source and the control voltage may be obtained by comparison of the auxiliary voltage amplified with a voltage issuing direct from the auxiliary voltage source.

The comparison of the two voltages is preferably carried out prior to rectification.

It is preferable that the auxiliary voltage should be generated in the circuit itself by causing the latter to self-oscillate, it being thus possible for the auxiliary voltage rectified to be used directly as the control voltage. In some cases, improved control may be obtained by supplementarily amplifying the auxiliary voltage subsequent to the amplification in the amplifier circuit and prior to the rectification.

Supplementary amplification after rectification is also possible, but this amplification requires the use of a slightly more involved circuit.

The invention may be applied for example to a high or intermediate-frequency amplifier, it being possible for the auxiliary voltage to have a low-frequency nature; under certain conditions use may be made, for example, of an auxiliary voltage having a frequency of 1000 C./Sec. If the oscillations to be amplified are modulated it is efficient to choose an auxiliary voltage whose frequency exceeds the highest modulation frequency, for example 20,000 C./Sec. The circuit may, however, also be used for the amplification of low-frequency oscillations, it being possible for the auxiliary voltage to have a higher frequency.

In order that the invention may be clearly understood and readily carried into effect it will now be described more fully with reference to the accompanying drawing.

Figure 1:
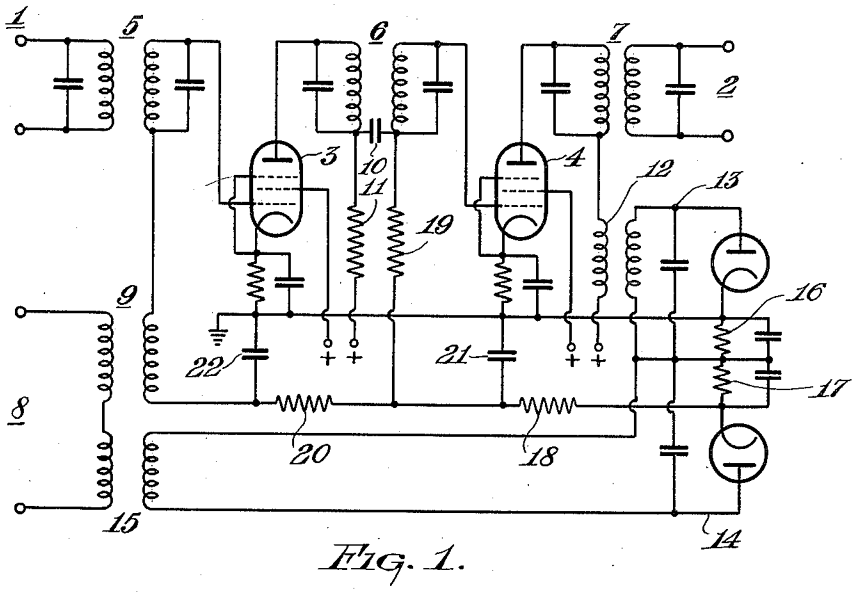

Figure 1 shows a circuit for amplifying high-frequency oscillations, the auxiliary voltage being constituted by a low-frequency oscillation. The high-frequency oscillations to be amplified are supplied to terminals 1, whereas the high-frequency oscillations amplified are obtained from the terminals 2. The amplification is carried out in two stages by means of two pentodes 3 and 4. The grid-control circuit of the first pentode 3 includes the second circuit of a high-frequency band pass filter 5 tuned to the oscillations to be amplified, whose first circuit is connected to the input terminals 1. The oscillations amplified in the first stage are transmitted via a similar band pass filter 6 to the control grid of the pentode 4 and the oscillations amplified in the second stage are transmitted via a similar band pass filter 7 to the output terminals 2. The first circuits of the band pass filters 6 and 7 are included respectively in the anode circuits of the pentode 3 and 4.

An auxiliary voltage source (not shown in greater detail) is connected to the terminals 8. The low-frequency auxiliary voltage is induced by means of a transformer 9 in the control grid circuit of the pentode 3. The auxiliary voltage amplified at the first stage is obtained, by means of a condenser 10, from a resistance 11 included in the anode circuit of the pentode 3 and is supplied to the control grid of the pentode 4. The auxiliary voltage amplified at the second stage is fed inductively to a rectifier circuit 13 by means of a coil 12 included in the anode circuit of the pentode 4.

The auxiliary voltage rectified in this circuit is compared with a voltage which comes direct from the auxiliary voltage source and is rectified in a rectifier circuit 14. This voltage coming direct from the auxiliary voltage source is fed via a transformer 15 to the rectifier circuit 14.

The ratio between the voltage induced in the grid circuit of the pentode 3 by the transformer 9 and that fed to the rectifier circuit 14 via the transformer 15 is chosen to equal the resultant gain of the two stages of the amplifier circuit.

The output resistances 16 and 17 of the two rectifiers are connected in opposition to each other, with the result that the difference between the voltages occurring across the said resistances is fed via the resistances 18 and 19 as a control voltage to the control grid of the pentode 4 and via a resistance 20 to the control grid of the pentode 3. This control voltage is smoothed in the usual manner by means of condensers 21 and 22.

The operation of the circuit arrangement may be accounted for as follows. Assuming the amplifier to be adjusted in such manner that at a given value of the gain, the control voltage has just the zero value, the direct voltages across the resistances 16 and 17 are equally high and opposite.

If the gain decreases for some reason (for example due to a variation of the supply voltage), the voltage across the resistance 16 becomes lower than that across the resistance 17 with the result that the difference of the two voltages is no longer zero and gives a higher positive potential to the control grids so that the gain increases. This increase continues until the original value of the gain has again been substantially reached. A similar consideration applies if the gain tends to increase for some reason. Thus the present circuit arrangement automatically restores the originally adjusted value of the gain.

Figure 2:
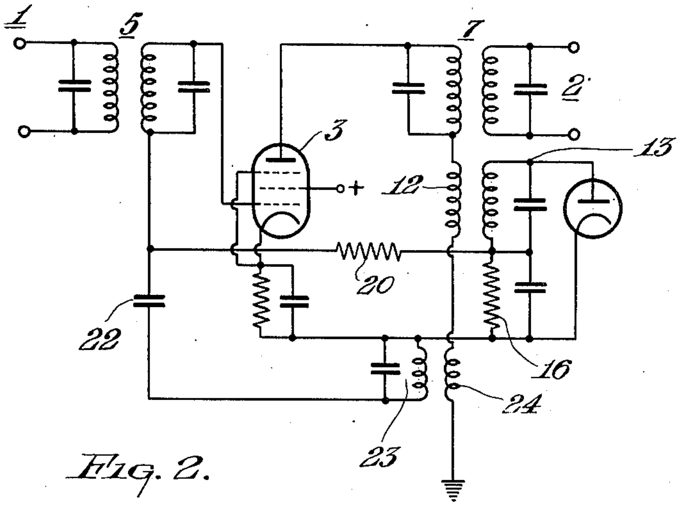

Figure 2 shows an alternative embodiment of the amplifier circuit according to the invention in which high-frequency oscillations are also amplified and use is also made of a low-frequency auxiliary voltage.

In this circuit, which contains but one amplifier stage, the auxiliary voltage is generated by causing the circuit to self-oscillate in a low frequency. For this purpose, the grid circuit of the pentode 3 includes a circuit 23 tuned to the desired frequency which is coupled inductively to a coil 24 included in the anode circuit. The voltage generated is fed by means of a coil 12 to the rectifier circuit 13. The automatic control may frequently be improved by again supplementarily amplifying the auxiliary voltage prior to rectification; this, however, is not shown in the figure. The rectified auxiliary voltage occurring across the resistance 16 is then fed via a resistance 20 to the control grid of the pentode 3 in such manner that it causes the control grid to become higher negative. This results in the gain decreasing to such extent that a very low auxiliary voltage is still generated.

If due to a disturbance the gain would tend to increase or decrease it is automatically restored to the point at which the same low value of the auxiliary voltage is again generated.

The value of the constant gain can be controlled by varying the extent of feedback between the circuit 23 and the feedback coil 24.

In the circuit arrangement shown in Figure 1 in which the auxiliary voltage is obtained from an auxiliary voltage source the gain can be controlled if desired by varying the ratio between the voltages to be compared.

The auxiliary voltage need not be sinusoidal and may under certain circumstances be formed by relaxation oscillations. In circuit arrangements in which the auxiliary voltage is generated by self-oscillating, such oscillations may be obtained efficiently by providing for a feedback via a network constituted by resistors and condensers.

If the auxiliary voltage is not sinusoidal, there is only need for the fundamental frequency of the voltage to be located outside the frequency band of the oscillations to be amplified.

What I claim is:

1. An amplifier arrangement having constant gain comprising an electric discharge system having control and output electrodes, a source of desired signals in a given range of frequencies, means to couple said desired signals to the control electrode of said electric discharge system, means to provide a voltage source of electric control oscillations of a frequency without the range of the said desired signals, means to supply part of the voltage from said source of control oscillations to the control electrode, an output stage, means to couple said output stage to the output electrode, means to rectify portions of the voltage supplied to the output stage containing the control oscillations and to rectify part of the voltage from said source of control oscillations, means to derive a difference voltage from the latter two rectified voltages, and means to apply said difference voltage to the control electrode of the said electric discharge system.

2. An amplifier arrangement having constant gain comprising a plurality of electric discharge tubes having each a grid, cathode and anode, said discharge tubes being connected together in cascade, a source of desired signals in a given range of frequencies, means to couple said desired signals to the control grid-cathode circuit of the first electric discharge tube in cascade, means to provide an external source of control oscillations of a frequency without the range of the said desired signals, first transformer means to couple said external source of oscillations to the control grid cathode circuit of the first electric discharge tube in cascade, an output stage, means to couple said output stage to the anode-cathode circuit of the last electric discharge tube connected in cascade, a first diode rectifier, second transformer means to connect said first diode to the output stage rectifying that portion of the amplifier output containing the control oscillations, a second diode rectifier connected to the first transformer means rectifying a portion of the control oscillations, impedance means to connect the first and second diode rectifiers having a voltage thereon equivalent to the difference of the rectified output of the said diode rectifiers, and means to apply said difference voltage to the grid-cathode circuits of the electric discharge tube.

3. An amplifier arrangement comprising a plurality of electric discharge tubes having each a grid, cathode and anode, said discharge tubes being connected together in cascade, a source of desired signals in a given range of frequencies, means to couple said desired signals to the control grid-cathode circuit of the first electric discharge tube in cascade, means to provide an external source of control oscillations of a frequency without the range of the said desired signals, first transformer means to couple said external source of oscillations to the control grid-cathode circuit of the first electric discharge tube in cascade, an output stage, means to couple said output stage to the anode-cathode circuit of the last electric discharge tube connected in cascade, a first diode rectifier, second transformer means to connect said first diode to the output stage rectifying that portion of the amplifier output containing the control oscillations, a second diode rectifier connected to the first transformer means rectifying a portion of the control oscillations, means to vary the ratio between the rectified output of said first and second diode rectifier, impedance means to connect the first and second diode rectifiers having a voltage thereon equivalent to the difference of the rectified output of the said diode rectifiers, and means to apply said difference voltage to the grid-cathode circuits of the electric discharge tube.

4. An amplifier arrangement comprising an electric discharge tube having grid, anode and cathode, a source of desired signals in a given range of frequencies, means to couple said desired signals to the grid-cathode circuit of said electric discharge tube, a relaxation oscillator providing a source of electric control oscillations at a frequency without the range of the said desired signals, means to supply part of the voltage from said source of control oscillations to the control electrode, an output stage, means to couple said output stage to the output electrode, means to rectify portions of the voltage supplied the output stage containing the control oscillations and to rectify a portion of the voltage from said source of control oscillations, means to derive a difference voltage from the latter two rectified voltages and means to apply said difference voltage to the grid-cathode circuit of said electric discharge tube.

5. A circuit arrangement for amplifying signals within a predetermined frequency range with constant gain, comprising an amplifying system provided with means to control the amplification thereof, means to apply said signals as an input to said amplifier, a source of control oscillations having a frequency beyond said predetermined range, means to apply control oscillations from said source as an input to said amplifier, means coupled to the output of said amplifier to derive therefrom a first voltage proportional to the amplitude of the amplified control oscillations, means coupled to said source to derive therefrom auxiliary control oscillations having an amplitude bearing a predetermined relation with respect to the amplitude of the control oscillations applied to said amplifier, means to derive from said auxiliary control oscillations a second voltage proportional to the amplitude of said auxiliary control oscillations, means to compare the relative amplitude of said first and second voltages to produce a difference voltage, and means to apply said difference voltage to said amplification control means of said amplifier.

6. A circuit arrangement for amplifying signals within a predetermined frequency range with constant gain, comprising an amplifying system provided with voltage-responsive gain control means, means to apply said signal as an input to said amplifier, a source of control oscillations having a frequency beyond said predetermined range, means to apply control oscillations from said source as an input to said amplifier, means coupled to the output of said amplifier to rectify the amplified control oscillations, means coupled to said source to derive therefrom auxiliary control oscillations having an amplitude corresponding to the amplitude of the amplified control oscillations in the condition where the gain of the amplifier is at the desired value, means to rectify the auxiliary control oscillations, means to compare the relative amplitude of the amplified control oscillations and the auxiliary control oscillations to produce a control voltage proportional to the difference therebetween, which difference depends on the deviation in amplification from the desired value and means to apply the control voltage to said gain control means to restore the said gain to the desired value.

7. A circuit arrangement for amplifying signals within a predetermined frequency range with constant gain, comprising an amplifying system provided with voltage-responsive gain control means, means to apply said signal as an input to said amplifier, a source of control oscillations having a frequency beyond said predetermined range and having an amplitude subject to fluctuations, means to apply control oscillations from said source as an input to said amplifier, means coupled to the output of said amplifier to rectify the amplified control oscillations, means coupled to said source to derive therefrom auxiliary control oscillations having an amplitude bearing a predetermined relation with respect to the amplitude of the amplified control oscillations in the condition where the gain of the amplifier is at the desired value, means to rectify the auxiliary control oscillations, means to compare the relative amplitude of the amplified control oscillations and the auxiliary control oscillations to produce a control voltage proportional to the difference therebetween, which difference depends on the deviation in amplification from the desired value and means to apply the control voltage to said gain control means to restore the said gain to the desired value.

8. A circuit arrangement for amplifying signals within a predetermined frequency range with constant gain, comprising an electron discharge tube having cathode, control and output electrodes, means to apply said signal to the control electrode of said tube, a source of control oscillations having a frequency beyond said predetermined range, means to apply control oscillations from said source to the control electrode of said tube, means coupled to the output electrode of said tube to rectify the amplified control oscillations, means coupled to said source to derive therefrom auxiliary control oscillations having an amplitude bearing a predetermined relation with respect to the amplitude of the amplified control oscillations in the condition where the gain of the tube is at the desired value, means to rectify the auxiliary control oscillations, means to compare the relative amplitude of the amplified control oscillations and the auxiliary control oscillations to produce a control voltage proportional to the difference therebetween, which difference depends on the deviation in amplification from the desired value and means to apply the control voltage to the control electrode of said tube to restore the said gain to the desired value.

9. A circuit arrangement for amplifying signals within a predetermined frequency range with constant gain, comprising a cascade amplifying system provided with a plurality of electron discharge tubes each having cathode, control and output electrodes, means to apply said signal as an input to said amplifier, a source of control oscillations having a frequency beyond said predetermined range, means to apply control oscillations from said source as an input to said amplifier, means coupled to the output of said amplifier to rectify the amplified control oscillations, means coupled to said source to derive therefrom auxiliary control oscillations having an amplitude bearing a predetermined relation with respect to the amplitude of the amplified control oscillations in the condition where the gain of the amplifier is at the desired value, means to rectify the auxiliary control oscillations, means to compare the relative amplitude of the amplified control oscillations and the auxiliary control oscillations to produce a control voltage proportional to the difference therebetween, which difference depends on the deviation in amplification from the desired value and means to apply the control voltage to the control electrode of one of said tubes to restore the said gain to the desired value.

JOHANNES JACOBUS ZAALBERG VAN ZELST.

REFERENCES CITED

The following references are of record in the file of this patent:

UNITED STATES PATENTS

| Number | Name | Date |
|---|---|---|
| 2,281,312 | Krist | Apr. 28, 1942 |
| 2,296,626 | Blumlein | Sept. 22, 1942 |
| 2,346,545 | Anderson | Apr. 11, 1944 |
| 2,497,883 | Harris | Feb. 21, 1950 |